(12) United States Patent
Asai (10) Patent No.: US 6,462,419 B1
(45) Date of Patent: Oct. 8, 2002

(54) SEMICONDUCTOR DEVICE AND METHOD FOR MANUFACTURING THE SAME

(75) Inventor: Shuji Asai, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/593,892

(22) Filed: Jun. 14, 2000

(30) Foreign Application Priority Data

Jun. 16, 1999 (JP) .......................................... 11-169903

(51) Int. Cl.⁷ .................... H01L 23/48; H01L 23/52; H01L 29/40
(52) U.S. Cl. ................. 257/774; 257/510; 257/698; 257/773
(58) Field of Search ................. 257/774, 775, 257/769, 773, 622, 626, 698, 510, 508, 501, 520

(56) References Cited

U.S. PATENT DOCUMENTS

| 5,487,218 A | * | 1/1996 | Bhatt et al. | .............. 29/852 |
| 5,634,268 A | * | 6/1997 | Dalal et al. | .............. 29/840 |
| 5,729,435 A | * | 3/1998 | Iijima et al. | .............. 361/704 |
| 5,834,844 A | * | 11/1998 | Akagawa et al. | .............. 257/734 |

FOREIGN PATENT DOCUMENTS

| JP | 63-213943 | 9/1988 | ........... H01L/21/88 |
| JP | 5-47937 | 2/1993 | ........... H01L/21/90 |
| JP | 9-69593 | 3/1997 | ......... H01L/23/373 |
| JP | 11-108551 | 4/1999 | ........... F25D/25/02 |
| JP | 2001015654 A | * | 1/2001 | |

* cited by examiner

*Primary Examiner*—Eddie Lee
*Assistant Examiner*—Chris Chu
(74) *Attorney, Agent, or Firm*—Hayes Soloway, P.C.

(57) ABSTRACT

A semiconductor element and a circuit thereof are formed on the front surface of a semiconductor substrate of a semiconductor device and are protected with an insulating film. An opening is bored that penetrates from the front surface to the back surface of the substrate at a predetermined position of the substrate. A buried wiring line of a metal film, which becomes a semiconductor substrate penetrative conductor, is formed on the inner surface of the opening. The space enclosed by the buried wiring line is filled with a resin film. A grounding pad or a terminal pad is disposed at a predetermined position on the back surface of the semiconductor substrate.

8 Claims, 5 Drawing Sheets

SEMICONDUCTOR DEVICE AND METHOD FOR MANUFACTURING THE SAME

BACKGROUND OF THE INVENTION

1. Field of the Invention

This invention relates to a semiconductor device and a method for manufacturing the same and, more specifically, to the structure and formation method of a conductor penetrating a semiconductor substrate which connects both sides of the semiconductor substrate electrically.

2. Description of Related Art

In order to ground the analog integrated circuit and the output element of a high frequency transistor, an electric connection is carried out between a group of circuit elements on the front surface of a semiconductor chip and the back surface thereof through a conductor disposed in a through hole of a substrate thereof. The semiconductor chip is connected to an electrode of a mounting substrate or package such that the back surface of the chip is bonded to the metallic surface of the mounting substrate or package with a solder material, and a metallic wire is bonded to a wiring pad of the front surface of the chip. Grounding can be also performed by the use of the metallic wire here. However, if so, the circuit is liable to become unstable because the metallic wire includes an inductor component or resistance component. Accordingly, in order to restrain the inductor component or resistance component and stabilize high frequency performance, grounding is performed such that a direct connection is formed by penetrating the substrate from the front surface to the back surface thereof over a short distance.

In general, the semiconductor substrate penetrative conductor is conventionally formed by grinding and thinning the substrate first and then disposing a photoresist film pattern on the back surface and using a through hole made by dry etching etc. In this case, it is necessary to align the receiving electrode on the front surface with the etched hole from the back surface. However, the alignment accuracy between the front surface and the back surface of the substrate is prone to error, and therefore the receiving electrode of the front surface is required to be of a sufficient size.

Figure 1A:
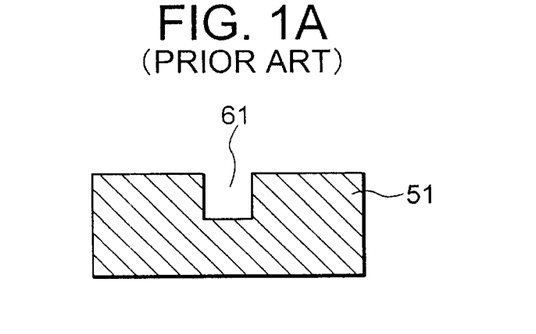
FIG. 1A is a step of forming a non-through hole.
Figure 1B:
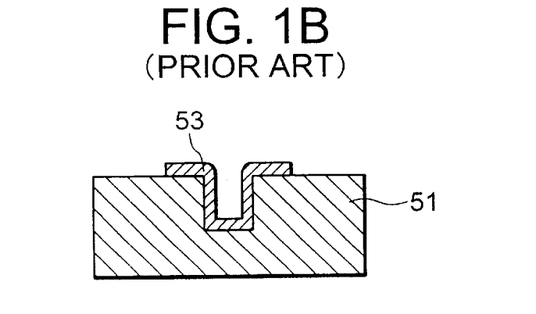
FIG. 1B is a step of forming a buried wiring line.
Figure 1C:
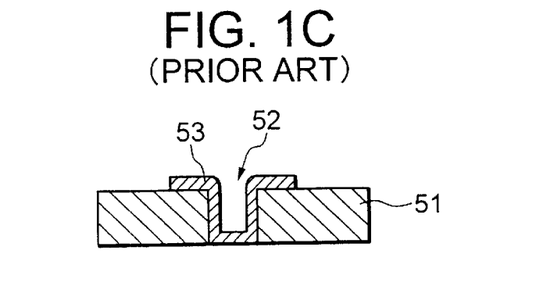
FIG. 1C is a step of grinding the back surface of the substrate.
Figure 1D:
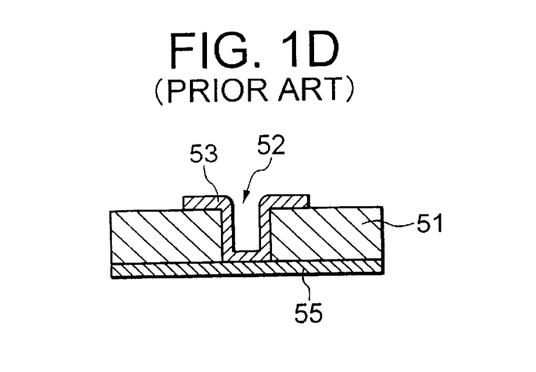
FIG. 1D is a step of forming a metallic layer on the back surface.

In order to solve this problem, the present applicant has proposed in Japanese Laid-Open Patent Publication No. H5-47937 that the semiconductor substrate penetrative conductor be holed directly from the front surface. FIG. 1A through FIG. 1D are typical sectional views for explaining a conventional method of forming the semiconductor substrate penetrative conductor. FIG. 1A shows a step of forming a non-through hole, FIG. 1B shows a step of forming a buried wiring line, FIG. 1C shows a step of grinding the back surface of the substrate, and FIG. 1D shows a step of forming a metallic layer on the back surface.

Referring to FIG. 1A, elements and circuits, not shown, are formed on the front surface of the semiconductor substrate 51. Additionally, a non-through hole 61 from the front surface to a certain depth of the semiconductor substrate 51 is formed by dry etching during this step. The depth is, for example, 100 μm with respect to the substrate thickness of 400 μm.

Thereafter, as shown in FIG. 1B, a wiring metal is put into the non-through hole 61 by plating it with Au etc. so as to form a buried wiring line 53 as a part of the wiring step.

Thereafter, as shown in FIG. 1C, the back surface of the semiconductor substrate 51 is ground until the substrate 51 attains the thickness of 100 μm, and thereby the bottom of the buried wiring line 53 is exposed, and the semiconductor substrate penetrative conductor 52 is completed.

Thereafter, as shown in FIG. 1D, a back surface metal 55 for grounding is formed on the back surface of the semiconductor substrate 51, and thereby the semiconductor substrate penetrative conductor 52 is grounded.

However, in the conventional manufacturing method, it is difficult to accurately stop the grinding of the back surface at the bottom of the buried wiring line 53. As a countermeasure against this, an attempt is carried out to form the semiconductor substrate penetrative conductor 52 deeply and grind the back surface to beyond the bottom of the buried wiring line 53. However, in this case, the unburied though hole under the bottom of the semiconductor substrate penetrative conductor 52 is exposed because the buried metal that makes up the bottom of thereof is removed. If the through hole remains without being buried when the back surface metal 55 is formed, a solder material is sucked up by the through hole and enters it when the semiconductor chip is bonded to a package etc. with the solder material, and a situation occurs in which the penetrative conductor 52 of the substrate 51 first cracks, for example, because of the difference in the coefficient of thermal expansion between the semiconductor substrate 51 and the solder material. Accordingly, disadvantageously, the crack causes the breakage or deterioration of the semiconductor elements or circuit wiring lines disposed on the front surface of the substrate.

As a countermeasure against this, the inside of the penetrative conductor 52 can be completely buried by the plating of Au. However, it was confirmed that cracks appeared in the semiconductor substrate 51 because of the difference in the coefficient of thermal expansion between Au and the semiconductor substrate 51 from the heat history during the manufacturing. Especially, when a lot of semiconductor substrate penetrative conductors 52 were disposed in a row keeping them near each other for grounding, the substrate between the penetrative conductors 52 was noticeably damaged. Therefore, trouble also occurred in completely burying the penetrative conductors 52 with metal.

SUMMARY OF THE INVENTION

It is an object of the present invention to provide a semiconductor device having a stable conductor which penetrates a semiconductor substrate, wherein the semiconductor device does not cause cracks etc. in a semiconductor substrate and exerts no influence upon semiconductor elements etc. on the front surface of the substrate, and provide a method of forming the penetrative conductor.

The semiconductor device of the present invention comprises a semiconductor substrate having an opening penetrating from the front surface to the back surface of the semiconductor substrate at a predetermined position thereof; a semiconductor element formed on the front surface of the semiconductor substrate and a circuit therearound; a conductive film (back surface conductive film) formed on the back surface of the semiconductor substrate; a metal film (through metal film) formed on an inner wall of the opening and connected electrically to the conductive film; and resin with which space enclosed by the metal film formed in the opening is filled.

The conductive film may be a pad processed to cover the opening. The conductive film can cover the entire back surface of the semiconductor substrate. Preferably, the conductive film is formed to be electrically connectable by solder to a conductor disposed in any one of a package and a mounting substrate for mounting the semiconductor device.

A method of manufacturing a semiconductor device according to the present invention comprises the steps of forming a non-through hole with a predetermined diameter, the non-through hole passing from a front surface of a semiconductor substrate on which a semiconductor element and a circuit thereof are formed halfway to a back surface of the semiconductor substrate at a predetermined position thereof; forming a metal film at a predetermined region of the front surface of the semiconductor substrate and on an inner wall of the non-through hole; filling a space enclosed by the metal film formed on the inner wall of the non-through hole with resin; and grinding the back surface of the semiconductor substrate until the metal film and the resin are exposed.

There can be further included a step of forming a conductive layer at a predetermined region covering the metal film and the resin exposed on the back surface of the semiconductor substrate.

A method of manufacturing a semiconductor device according to another aspect of the present invention comprises the steps of forming a pad for connection as a part of a metal wiring line on the front surface of a semiconductor substrate on which a semiconductor element and a circuit thereof are formed; forming a through hole with a predetermined diameter in the semiconductor substrate so as to reach the pad from the back surface of the semiconductor substrate; forming a metal film on an inner surface of the through hole, on the bottom of the through hole and on the entire back surface of the semiconductor substrate; filling the space enclosed by the metal film of the through hole with resin, and grinding the back surface of the semiconductor substrate until the metal film formed on the back surface of the semiconductor substrate is exposed in a state where the space is filled with the resin.

There can be further included a step of forming a conductive layer at a predetermined region covering the through hole on the back surface of the semiconductor substrate.

According to the present invention, the semiconductor device is constructed such that the space in the semiconductor substrate penetrative conductor is not completely filled with metal, and the metal layer is designed to have a thickness by which grounding conduction can be secured, and, in addition, the through hole enclosed by the metal layer is filled with resin softer than the metal. Accordingly, the resin absorbs the stress of heat history, and the solder material is prevented from being sucked up when a chip is bonded. Therefore, cracks are not caused in the semiconductor substrate near the semiconductor substrate penetrative conductor. Therefore, no influence is exerted upon semiconductor elements or circuit wiring lines disposed on the front surface of the semiconductor substrate. Additionally, a technique of applying vertical dry processing to the semiconductor substrate is advancing, and a connection can be established only by a metal layer whose electric resistance is low. Therefore, it becomes possible to provide and ground a lot of semiconductor substrate penetrative conductors having a minute diameter.

BRIEF DESCRIPTION OF THE DRAWINGS

FIG. 1A through FIG. 1D are sectional views showing the sequential steps of a conventional method of forming a semiconductor substrate penetrative conductor.

FIG. 4A through FIG. 4D are sectional views showing the sequential steps of a method of forming a conductor penetrating a semiconductor substrate of the semiconductor device according to the first embodiment of the present invention.

FIG. 6A through FIG. 6D are sectional views showing the sequential steps of a method of forming a conductor penetrating a semiconductor substrate of the semiconductor device according to the second embodiment of the present invention.

DESCRIPTION OF THE PREFERRED EMBODIMENTS

Figure 2:
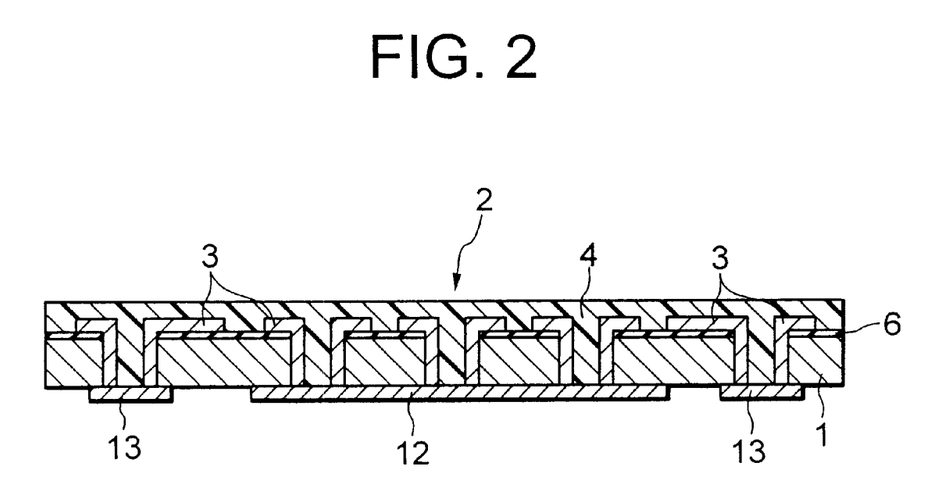
FIG. 2 is a typical sectional view of a semiconductor device according to a first embodiment of the present invention.

The preferred embodiments of the present invention will be described hereinafter with reference to the attached drawings. FIG. 2 is the typical sectional view of a semiconductor device according to a first embodiment of the present invention.

The semiconductor device according to the first embodiment of the present invention has a semiconductor substrate 1. A semiconductor element (not shown) and a circuit thereof (not shown) are formed on the front surface of the substrate 1 and are protected with an insulating film 6. Openings are bored through the substrate 1 so as to penetrate from the front surface to the back surface of the substrate 1 at predetermined positions thereof. Buried wiring lines 3 of penetrative metal films that make up a semiconductor substrate penetrative conductor are formed in the inside of the openings. Open spaces enclosed by the buried wiring lines 3 are filled with a resin film 4. Back surface conductive films are formed on the back surface of the semiconductor substrate at predetermined positions. The buried wiring lines 3 are electrically connected to the back surface conductive films. The back surface conductive film is a grounding pad 12 or a terminal pad 13 according to the intended purpose.

The influence of an inductor component of a metallic wire can be excluded by connecting an electrode other than the grounding to the terminal pad 13 formed on the back surface through the penetrative metal film on the semiconductor substrate penetrative conductor 2, as shown in FIG. 2, and connecting the terminal pad 13 directly to an electrode of a mounting substrate or package with a solder material. In this case, a FET source electrode to be grounded is connected to a large, wide grounding pad 12 in the middle of the chip, and a gate electrode for inputting or a drain electrode for outputting is connected to the small terminal pad 13 at the peripheral of the semiconductor substrate 1.

Figure 3:
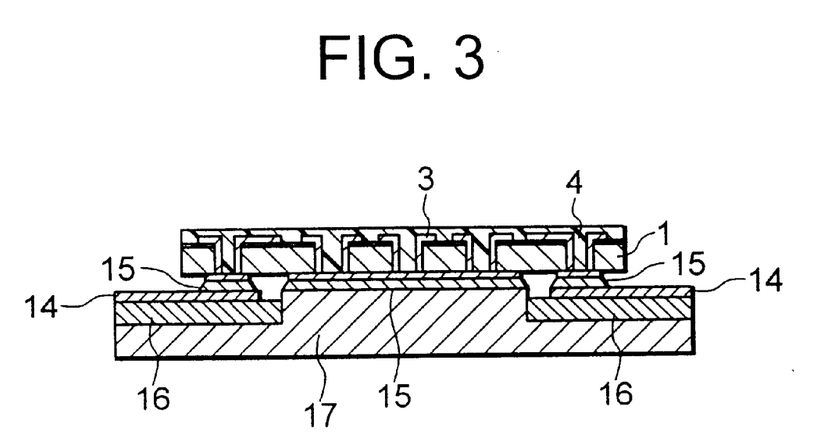
FIG. 3 is a typical sectional view showing the semiconductor device of FIG. 2 mounted on a package.

FIG. 3 is a typical sectional view showing the semiconductor device of FIG. 2 mounted on the package. Corresponding to the grounding pad 12 in the middle of the semiconductor substrate 1, the package is provided with a grounding metallic body 17. The semiconductor substrate 1 is grounded and, at the same time, radiates heat by connecting the grounding pad 12 to the grounding metallic body 17 with the solder material 15. The terminal pad 13 at the periphery of the semiconductor substrate 1 is connected to the terminal wiring line 14 of the package with the solder material 15. The terminal wiring line 14 is insulated from the grounding metallic body 17 by ceramics 16.

Conventionally, an attempt has been made to dispose an electrode pad on the back surface of the substrate. However, there is a fear that the solder material 15 will be sucked into the hole of the semiconductor substrate penetrative conductor because the hole thereof remains without being blocked up. Therefore, it was necessary to dispose the terminal pad at a position other than the center of the semiconductor penetrative conductor. According to the present invention, since the inside of the penetrative conductor 2 is filled with the resin film 4, the solder material 15 is not sucked into the hole, and the terminal pad 13 can be disposed directly at the position of the penetrative conductor 2. Accordingly, the area occupied by the thermal pad 13 can be reduced in the semiconductor substrate, and the area of the grounding pad 12 for grounding or cooling can be kept wide in proportion to the reduction of the area of the terminal pad 13. In addition, since a bonding wire is not used, an inductor component or a resistance component can be reduced, and high frequency performance in a millimeter wave band can be stabilized.

FIG. 2 shows a structure in which the grounding pad 12 and the terminal pad 13 are disposed on the back surface of the semiconductor substrate 1. Instead, a structure may be built in which only the grounding pad 12 is disposed on the entire back surface of the semiconductor substrate 1, and the terminal pad other than the grounding pad is disposed on the surface of a semiconductor chip and is bonded to the electrode of the mounting substrate or package with a metallic wire.

Figure 4A:
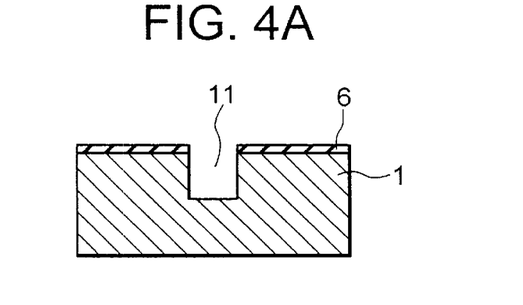
FIG. 4A is a step of forming a non-through hole.
Figure 4B:
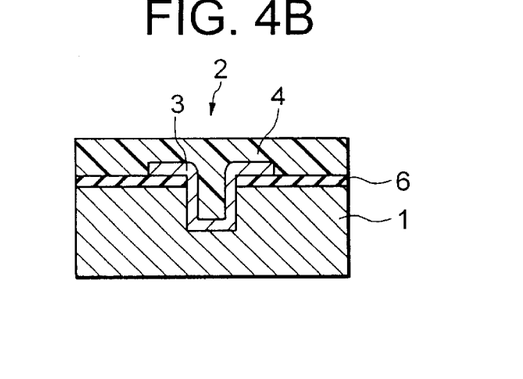
FIG. 4B is a step of forming a buried wiring line and a resin film.
Figure 4C:
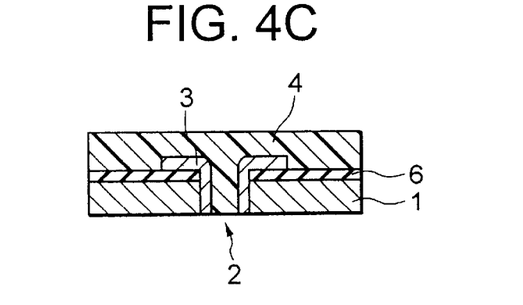
FIG. 4C is a step of grinding the back surface of the substrate.
Figure 4D:
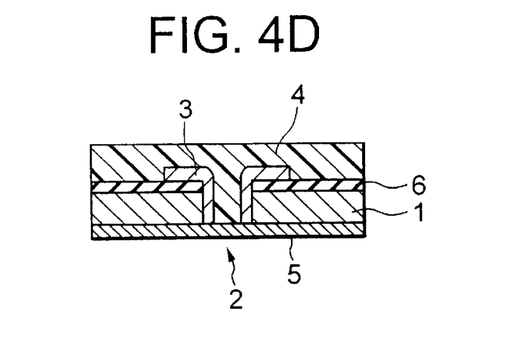
FIG. 4D is a step of forming a metallic layer on the back surface.

Referring now to the attached drawings, a description will be provided of a method of forming a semiconductor substrate penetrative conductor in a semiconductor device according to the first embodiment of the present invention. FIGS. 4A through 4D are typical sectional views for explaining the method of forming a semiconductor substrate penetrative conductor in the semiconductor device according to the first embodiment of the present invention. FIG. 4A is a step of forming a non-through hole, FIG. 4B is a step of forming a buried wiring line and a resin film, FIG. 4C is a step of grinding the back surface of the substrate, and FIG. 4D is a step of forming a metallic layer on the back surface. Herein, the semiconductor device is a high frequency transistor and is described in a GaAs field-effect transistor (GaAs FET).

As shown in FIG. 4A, a GaAs FET element (not shown) is first formed on the front surface of the 600 $\mu$m-thick semiconductor substrate 1 of semi-insulating GaAs and is covered with an insulating film 6 of, for example, $SiO_2$. Simultaneously with the formation of a through hole in the electrode of the FET element, an opening is formed in the front surface of the semiconductor substrate 1 near a source electrode. Dry etching is newly performed to reach a depth of about 130 $\mu$m, with a 30 $\mu$m-square opening of a photoresist film of a thickness of about 10 $\mu$m as a mask. The dry etching is performed according to an ICP (Inductive Coupled Plasma) method in which a radio-frequency bias is applied, and argon gas (Ar gas) of several tens % is added to chlorine gas. Since the ICP method can cause the gas to turn plasmatic at a high degree of vacuum (i.e., small gas-pressure), residue gas can be exhausted from a deep opening, and the radical of the etching gas can be supplied, and, in addition, a nearly vertical, deep non-through hole 11 can be formed by fast etching.

Thereafter, as shown in FIG. 4B, a wiring step is carried out in which a 50 nm-thick Ti and a 200 nm-thick Au are deposited by sputtering for the feed power of plating. They are deposited also on the side of the deep non-through hole 11 at a thickness of about 30% of the front surface of the semiconductor substrate. Thereafter, the Au plating of 5 $\mu$m in thickness is applied while masking it with a photoresist film pattern. The Au plating of a similar thickness to the front surface of the substrate can be applied also in the non-through hole 11 by shaking a plating solution while adding a weak ultrasonic wave. Thereafter, the photoresist film is removed, and Ar ion milling is performed, thus removing the Au/Ti layer used for the feed power by etching.

Subsequent to this, a resin film 4 of BCB (benzocyclobutene) with a low dielectric constant is applied to be 20 $\mu$m thick as an interlayer insulation film. In practice, the application process is divided into two parts, each of 10 $\mu$m, is applied. The BCB resin film 4 is caused to enter the semiconductor substrate penetrative conductor 2 by dripping and heaping up the resin liquid on the substrate, and the substrate is rotated to obtain a predetermined thickness, and the solvent is evaporated. Since the front surface of the substrate is hardened and, thereby, the solvent is confined therein if the temperature is rapidly raised, the process is conducted while expending sufficient time at a low temperature or raising the temperature slowly. After applying it twice, the BCB resin is hardened at 300° C. Thus, open spaces enclosed by the buried wiring line 3 in the penetrative conductor 2 are filled with the BCB resin film 4. A through hole (not shown) is formed in the BCB resin film so as to form wiring lines and pads, and a protective film etc. are provided, thus completing the structure of the front surface side of the semiconductor substrate.

Thereafter, as shown in FIG. 4C, the back surface of the semiconductor substrate 1 is ground to a thickness of 100 $\mu$m. Accordingly, the bottom of the buried wiring line 3 is removed, the buried wiring line 3 on the side is exposed, and the inside BCB resin film 4 is also exposed.

Thereafter, as shown in FIG. 4D, the back surface of the semiconductor substrate 1 undergoes Ar cleaning in a sputtering device, and a 50 nm-thick Ti and a 400 nm-thick Au, which are each a conductive film of the back surface, are deposited by sputtering so as to form a back surface metal 5. As a result, the back surface metal 5 is electrically connected to the buried wiring line 3 on the side of the penetrative conductor. The back surface metal 5 is herein formed, but the present invention is not limited to the metal. Any conductive film can be used instead of this.

The back surface pads, such as the grounding pad 12 and the terminal pad 13, shown in FIG. 2 are formed in the same way as the wiring line of the front surface. After Ti and Au used as the back surface electrode are deposited by sputtering, a photoresist film pattern is provided, and Au plating is performed. An extra Au/Ti layer is then removed by ion milling, and an electrode pad is formed. The exposure alignment of the photoresist film is carried out by a mark formed in the penetrative conductor 2. The back surface pad is a metal herein, but the present invention is not limited to the metal. Any conductive film can be used instead of this.

Thereafter, since elements required for the semiconductor device are thus formed on the wafer, the wafer is diced, and the individual semiconductor devices are chipped. An AuSn solder material 15 is then disposed on the metallic surface of the package, as shown in FIG. 3, and heat treatment is carried out to soften it. Thereby, the grounding pad 12 on the back surface of the chip is adapted and bonded. Also in the terminal pad 13, the AuSn solder material 15 is disposed on the terminal wiring line 14, heat treatment is then carried out to soften it, and the grounding pad 12 on the back surface of the chip is adapted and bonded.

In the semiconductor device according to the embodiment of the present invention, since the through hole of the semiconductor substrate penetrative conductor is blocked up with the resin, a situation does not occur in which the solder material is sucked up and, accordingly, the semiconductor substrate near the penetrative conductor becomes cracked. Additionally, since the inside of the penetrative conductor is not completely filled with the metal, cracks are not caused therein because of the metallic stress of heat history. Additionally, cracks were not caused when a plurality of 30 $\mu$m-square semiconductor substrate penetrative conductors were spaced at intervals of 30 $\mu$m.

Figure 5:
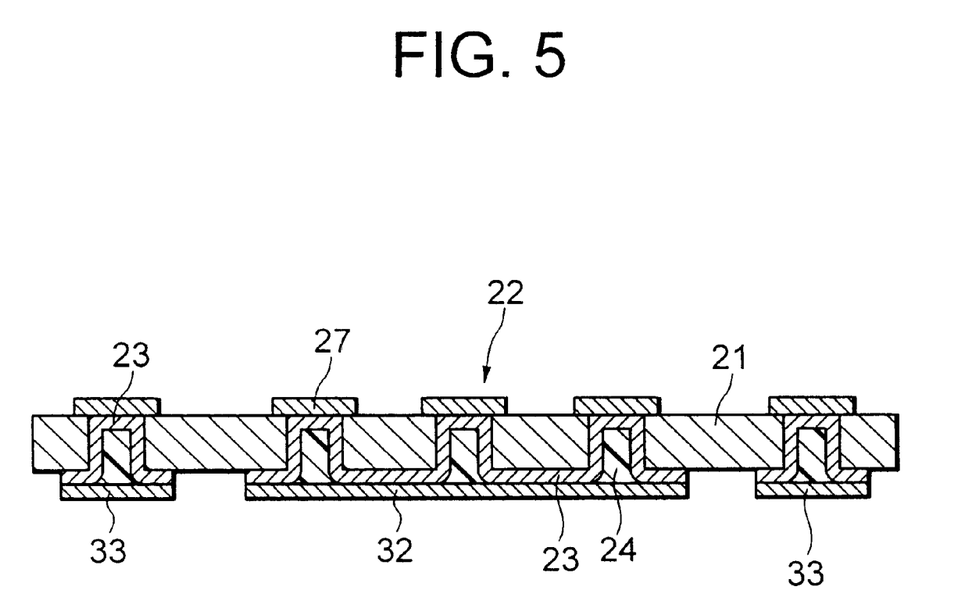
FIG. 5 is a typical sectional view of a semiconductor device according to a second embodiment of the present invention.

Now, a description will be provided of a semiconductor device and a method of forming a semiconductor substrate penetrative conductor thereof according to a second embodiment of the present invention. FIG. 5 is the typical sectional view of the semiconductor device according to the second embodiment of the present invention.

The semiconductor device according to the second embodiment has a semiconductor substrate 21. A semiconductor element (not shown) and a circuit thereof (not shown) are formed on the front surface of the substrate 21, and front surface pads 27 to be connected to a semiconductor substrate penetrative conductor 22 are formed at predetermined positions thereof. Openings are bored through the substrate 21 so as to penetrate from the back surface of the substrate 21 to the back surface of the front surface pad 27. Buried wiring lines 23 of penetrative metal films that make up the semiconductor substrate penetrative conductor 22 are formed in the inside of the openings. Open spaces enclosed by the buried wiring lines 23 are filled with a resin film 24.

Back surface conductive films are electrically connected to the buried wiring lines 23 extending to the back surface of the semiconductor substrate. The back surface conductive film is used as a grounding pad 32 or a terminal pad 33 according to the intended purpose.

The influence of an inductor component of a metallic wire can be excluded by connecting an electrode other than the grounding to the terminal pad 33 formed on the back surface of the substrate 21 through the penetrative metal film of the semiconductor substrate penetrative conductor 22, as shown in FIG. 5, and connecting the terminal pad 33 directly to an electrode of a mounting substrate or package with a solder material. In this case, a FET source electrode to be grounded is connected to a large, wide grounding pad 32 in the middle of the chip, and a gate electrode for inputting or a drain electrode for outputting is connected to the small terminal pad 33 at the peripheral of the semiconductor substrate 21. A detailed description of the connecting method of the mounting substrate or package is omitted because it is the same as the first embodiment described with reference to FIG. 2.

Conventionally, the semiconductor substrate penetrative conductor has been formed by boring an opening from the back surface of the substrate. The present invention is to be applied to the boring of the hole from the back surface thereof in the formation of the penetrative conductor in the semiconductor device in the second embodiment.

FIG. 5 shows a structure in which the grounding pad 32 and the terminal pad 33 are disposed on the back surface of the semiconductor substrate 21. Instead, a structure may be built in which only the grounding pad 32 is disposed on the entire back surface of the semiconductor substrate 21, and the terminal pads other than the grounding pad are disposed on the surface of a semiconductor chip and are bonded to the electrode of the mounting substrate or package with a metallic wire.

Figure 6A:
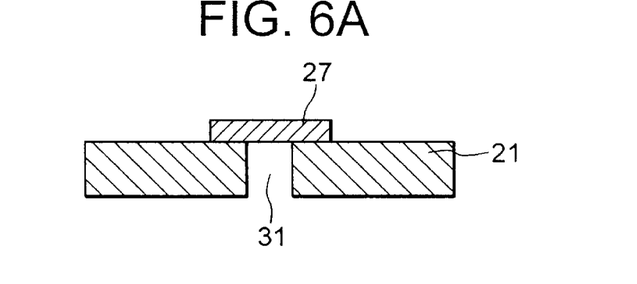
FIG. 6A is a step of forming a through hole.
Figure 6B:
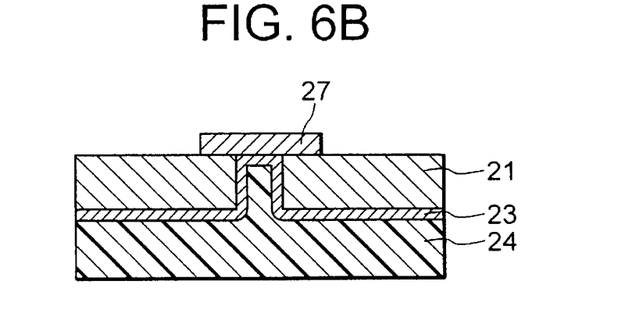
FIG. 6B is a step of forming a buried wiring line and a resin film.
Figure 6C:
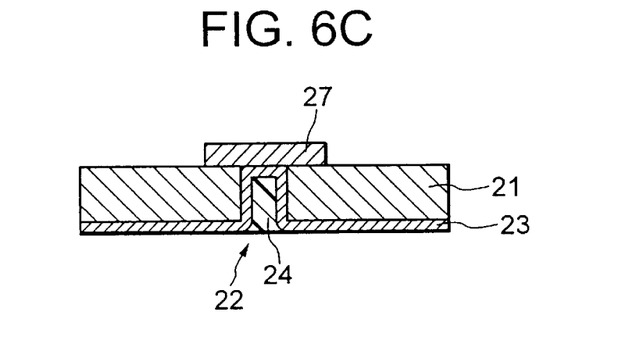
FIG. 6C is a step of grinding the back surface of the substrate.
Figure 6D:
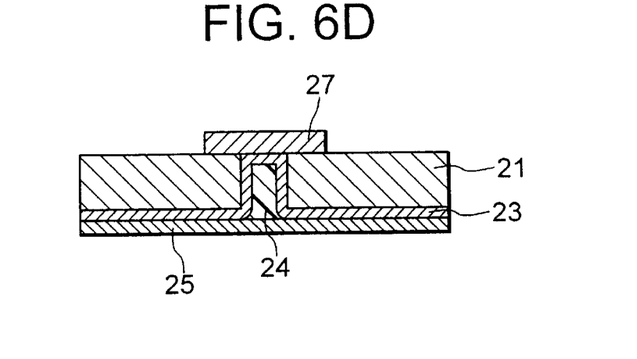
FIG. 6D is a step of forming a metallic layer on the back surface.

Now, a description will be provided of a method of forming a semiconductor substrate penetrative conductor in a semiconductor device according to the second embodiment of the present invention. FIGS. 6A through 6D are typical sectional views for explaining the method of forming the semiconductor substrate penetrative conductor in the semiconductor device according to the second embodiment of the present invention. FIG. 6A is a step of forming a through hole, FIG. 6B is a step of forming a buried wiring line and a resin film, FIG. 6C is a step of grinding the back surface of the substrate, and FIG. 6D is a step of forming a metallic layer on the back surface.

As shown in FIG. 6A, a front surface pad 27 is formed on the front surface of the semiconductor substrate 21 as an electrode or a wiring line. After forming an element and the wiring line (not shown) on the front surface, the back surface of the substrate 21 is ground so that the substrate 21 is thinned to be 100 $\mu$m thick. A photoresist opening is formed in the back surface of the semiconductor substrate 21 corresponding to the position of the front surface pad 27, and a through hole 31 is formed by dry etching. The etching is stopped when the backside of the front surface pad 27 is exposed.

Thereafter, as shown in FIG. 6B, a buried wiring line 23 is formed on the back surface of the substrate 21, on the side of the through hole 31, and on the bottom thereof. The space enclosed by the buried wiring line 23, which is a penetrative metal film in the through hole 31, is filled with a resin film 24. The buried wiring line 23 is subjected to sputtering deposition of Ti and Au and Au plating of thickness of 5 $\mu$m. Thereafter, the resin 24, such as polyimide or epoxy, is applied to the back surface, as the back surface is rotated, and is hardened.

Thereafter, as shown in FIG. 6C, the back surface of the semiconductor substrate 21 is ground to remove the resin film 24 on the back surface, and the surface of the buried wiring line 23 to which the Au plating is applied is exposed. As a result, the resin 24 remains in a state of being buried in the space enclosed by the buried wiring line 23 of the semiconductor substrate penetrative conductor 22.

Thereafter, as shown in FIG. 6D, Ti and Au are deposited by sputtering on the back surface in the form of a back surface metal 25 which is a back surface conductive film. The penetrative conductor 22 is filled with the resin 24, and the back surface becomes an almost flat metallic surface. The back surface metal 25 is formed herein. But, the present invention is not limited to the metal. Any conductive film can be used.

Thereafter, this is chipped and mounted as in the first embodiment. The back surface metal can be made in electrode pad as in the first embodiment.

The conditions imposed on the resin for filling the space in the penetrative conductor of the semiconductor device according to the embodiment of the present invention are that a change in quality or a big expansion does not occur because of heat treatment such as soldering after chipping, that cracks are not caused in the resin buried by grinding the back surface, and so on. The development of heat-resistant resin has been advanced recently, and options in the market are broad. Resins such as polyimide, epoxy, Teflon, and fluorine are available.

Cracking is easily caused in the resin when the outer diameter of the semiconductor substrate penetrative conductor exceeds several hundreds μm and broadens. Therefore, preferably, it does not exceed this. Additionally, it becomes difficult to draw out the solvent of the resin when the ratio of depth/diameter of the space in the buried wiring line formed in a non-through hole exceeds ten times. Therefore, the diameter of the penetrative conductor is limited.

In the embodiments, gallium arsenide (GaAs) is used for the semiconductor substrate. Instead, it can be applicable to Si, InP, etc., of course.

In the embodiments, Au plating is used for a metal buried as the semiconductor substrate penetrative conductor. Instead, Cu or Ni plating, sputtering deposition, or CVD can be performed. Carbon or resin including metal powder can be used as the back surface conductor, instead of the aforementioned metals.

As the solder material to be mounted, PbSn solder, which is general, or Sn or In as a single component can be used instead of AuSn. A resin bond including metal powder, such as an Ag paste, also can be used.

As described above, the semiconductor device of the present invention is constructed such that the space in the semiconductor substrate penetrative conductor is not completely filled with metal, and the metal film is designed to have a thickness by which grounding conduction can be secured, and, in addition, the space in the metal film is filled with a resin that is softer than the metal. Accordingly, the resin absorbs the stress of heat history, and the solder material is prevented from being sucked up when a chip is bonded. Therefore, cracks are not caused in the semiconductor substrate near the semiconductor substrate penetrative conductor. Therefore, no influence is exerted upon semiconductor elements or circuit wiring lines disposed on the front surface of the semiconductor substrate. Additionally, advantageously, it becomes possible to provide and ground a lot of semiconductor substrate penetrative conductors having a minute diameter.

What is claimed is:

1. A semiconductor device comprising:
    a semiconductor substrate having an opening penetrating from a front surface to a back surface of said semiconductor substrate;
    a semiconductor element formed on the front surface of said semiconductor substrate and having a metal wiring of a circuit of the semiconductor element formed thereon, said metal wiring contacted with the opening;
    a metal film formed on an inner wall of said opening, said metal film being in direct contact with and connected electrically to metal wiring;
    a conductive film, which is formed on the back surface of said semiconductor substrate, and electrically connected to and in direct contact with said metal film so as to cover an end face of said metal film in the opening; and
    a resin portion with which the space enclosed by said metal film formed in said opening is filled and in direct contact with said conductive film with which an end surface of said resin portion in the opening is covered.

2. The semiconductor device according to claim 1, wherein said conductive film is a pad processed to cover said opening.

3. The semiconductor device according to claim 1, wherein said conductive film covers the entire back surface of said semiconductor substrate.

4. The semiconductor device according to claim 1, wherein said conductive film is formed to be electrically connectable by solder to a conductor disposed in any one of a package and a mounting substrate for mounting said semiconductor device.

5. A method of manufacturing a semiconductor device comprising the steps of:
    forming a non-through hole passing from a front surface of a semiconductor substrate on which a semiconductor element and a circuit thereof are formed halfway to a back surface of said semiconductor substrate;
    forming a metal film on the front surface of said semiconductor substrate and on an inner wall of said non-through hole;
    filling a space enclosed by said metal film formed on the inner wall of said non-through hole with resin;
    forming an opening penetrating through said semiconductor substrate by grinding the back surface of said semiconductor substrate until said metal film and said resin are exposed, and
    forming a conductive film, which is formed so as to cover said exposed portion of said metal film and said resin.

6. The method according to claim 5, further comprising forming a conductive layer covering said metal film and said resin exposed on the back surface of said semiconductor substrate.

7. A method of manufacturing a semiconductor device comprising the steps of:
    forming a pad for connection as a part of a metal wiring line on a front surface of a semiconductor substrate on which a semiconductor element and a circuit thereof are formed;
    forming a through hole in said semiconductor substrate so as to reach said pad from a back surface of said semiconductor substrate;
    forming a metal film on an inner surface of said through hole, on a bottom of said through hole, and on the entire back surface of said semiconductor substrate;
    filling a space enclosed by said metal film of said through hole with resin; and
    grinding the back surface of said semiconductor substrate until said metal film formed on the back surface of said semiconductor substrate is exposed in a state where said space is filled with said resin.

8. The method according to claim 7, further comprising a step of forming a conductive layer covering said through hole on the back surface of said semiconductor substrate.

* * * * *

UNITED STATES PATENT AND TRADEMARK OFFICE
CERTIFICATE OF CORRECTION

PATENT NO.     : 6,462,419 B1
DATED          : October 8, 2002
INVENTOR(S)    : Asai, Shuji

It is certified that error appears in the above-identified patent and that said Letters Patent is hereby corrected as shown below:

<u>Column 9,</u>
Line 57, please insert -- said -- after "to".

<u>Column 10,</u>
Line 1, please change "the" to -- a --.

Signed and Sealed this

Sixteenth Day of December, 2003

JAMES E. ROGAN
*Director of the United States Patent and Trademark Office*